United States Patent [19]

Shimoda

[11] Patent Number: 5,570,061

[45] Date of Patent: Oct. 29, 1996

[54] SWITCHING CIRCUIT

[75] Inventor: Sadashi Shimoda, Tokyo, Japan

[73] Assignee: Seiko Instruments Inc., Japan

[21] Appl. No.: 140,228

[22] Filed: Oct. 20, 1993

[30] Foreign Application Priority Data

| Oct. 27, 1992 | [JP] | Japan | 4-288675 |
| Dec. 21, 1992 | [JP] | Japan | 4-340262 |
| Jan. 18, 1993 | [JP] | Japan | 5-006164 |

[51] Int. Cl.⁶ .................................................. G05F 1/10
[52] U.S. Cl. ..................... 327/545; 327/538; 327/332; 365/229
[58] Field of Search .................................. 307/570, 573, 307/359, 571, 296.4, 296.8, 355, 66; 327/538, 540, 541, 543, 545, 323, 332; 365/229; 326/33

[56] References Cited

U.S. PATENT DOCUMENTS

| 3,912,940 | 10/1975 | Vince | 307/64 |
| 4,288,865 | 9/1981 | Graham | 365/229 |
| 4,342,925 | 8/1982 | Schick | 307/270 |
| 4,451,742 | 5/1984 | Aswell | 365/229 |
| 4,456,833 | 6/1984 | Traub et al. | 307/80 |
| 4,492,876 | 1/1985 | Colbert et al. | 365/229 |
| 4,528,459 | 7/1985 | Wiegel | 307/66 |
| 5,375,246 | 12/1994 | Kimura et al. | 365/229 |

FOREIGN PATENT DOCUMENTS

| 2929515 | 10/1980 | Germany. |
| 3144696 | 5/1983 | Germany. |
| 3834867 | 1/1990 | Germany. |

OTHER PUBLICATIONS

IBM Technical Disclosure Bulletin, vol. 32, No. 2, Jul. 1989, NY NY, pp. 270–271, "Sensing Circuit For ORed Feedback-Controlled Voltage Regulators".

Primary Examiner—Timothy P. Callahan
Assistant Examiner—Jung Ho Kim
Attorney, Agent, or Firm—Adams & Wilks

[57] ABSTRACT

In a switching circuit, a first input terminal and a second input terminal are connected to an output terminal by switching transistors which are selectively activated to supply the desired input signal to the output terminal. In order to output selectively, a voltage detector detects a level of a first input voltage at the first input terminal so that either the first switching transistor or the second switching transistor turns on. The voltage at the output terminal is controlled by a voltage controlling circuit in accordance with the stability of the output signal. The voltage controlling circuit does this by controlling the conducting state of the first switching transistor so that a stable output voltage can be obtained. Since the voltage controlling circuit drives the gate of the first switching transistor, it may be a small device operable with low consuming current, thereby the chip size can be reduced.

9 Claims, 4 Drawing Sheets

SWITCHING CIRCUIT

BACKGROUND OF THE INVENTION

The present invention relates to a switching circuit formed of a monolithic IC.

A circuit diagram of a conventional switching circuit is shown in FIG. 2. This is a circuit diagram illustrating a circuit which is applied when output from a voltage detector 7 connected to an input terminal is used for changing input voltage and which may also be used for generating an interrupt signal when a microcomputer is provided as a load.

Firstly, the general operation of the switching circuit ignoring the interrupt signal generation capability thereof will be explained for simplifying the explanation. $V_1$ and $V_2$, which differ from each other, are inputted to input terminals 1 and 2 respectively. The input terminal 1 is connected to an output terminal 5 through a voltage regulator 3 and a switching transistor 4. The outer input terminal 2 is also connected to an output terminal 5 through a switching transistor 6. The switching transistors 4 and 6 are switched alternatively, which switching is conducted by the voltage detector 7. For example, voltages $V_1$ and $V_2$ are supplied to the input terminals 1 and 2 respectively and the voltage $V_1$ activates the voltage detector 7. When $V_1$ is greater than a predetermined voltage, the output of the voltage detector 7 turns on the switching transistor 4 and turns off the switching transistor 6. In this case, voltage regulated by the voltage regulator 3 is output to the voltage terminal 5. To the contrary, when the voltage $V_1$ falls to less than a predetermined voltage, the output of the voltage detector 7 inverts and the switching transistor 4 is turned off and the switching transistor 6 is turned on. Consequently, the voltage $V_2$ is output to the output terminal 5. In other words, voltage is stably supplied from the output terminal 5 regardless of the variation of the input voltage. The switching circuit of the present invention is a switching circuit which activates stably a system such as a microcomputer by means of output from this output terminal.

Next, use of an output signal of the voltage detector 7 as an interrupt signal to a microcomputer will be explained. In a microcomputer of a twin clock mode, a high clock mode and a low clock mode are interchanged with each other by this interrupt signal. In order to change the modes, the voltage at the input terminal 1 is increased so that the output of the voltage detector 7 inverts. With the rise of the voltage, the output of the voltage detector 7 inverts. As a result, the transistor 4 is turned on and the transistor 6 is turned off. Accordingly, voltage at the input terminal 1 is supplied to the output terminal 5. At the same time, the output signal of the voltage detector is also provided at a signal output terminal 17 and supplied to the microcomputer as an interrupt signal.

However, the prior art switching circuit has the following drawbacks. Output voltage from the voltage regulator has a regulated voltage, however since it passes through the switching transistor 4 the voltage drops in accordance with the transistor resistance, and the dropped voltage is output to the output terminal 5. This voltage drop is not constant, but depends on the quantity of current flowing in the switching transistor 4 accompanied by a variation of the current consumed by a load such as a microcomputer, and the resistance value of the transistor which is on. Therefore, the output terminal 5 doesn't always output a constant voltage despite being regulated by the voltage regulator 3. When current flowing in the switching transistor 4 is large, the size of the switching transistor 4 formed on a monolithic IC becomes large so that the price of the monolithic IC becomes expensive.

When the output terminal 5 connects with a load such as a microcomputer, an output signal of the voltage detector 7 is used as a voltage state transmitting signal outputted to a load, particularly, as an interrupt signal to the microcomputer. Namely, in a microcomputer of a twin clock mode, a high clock mode and low clock mode are interchanged by this interrupt signal. However, when voltage of the input terminal 1 increases and the output signal of the voltage detector 7 inverts, the microcomputer is changed to a high clock mode. At the same time, the transistor 4 is turned on, the transistor 6 is turned off, and an output voltage is output from the input terminal 1 to the output terminal 5. However, because of the fact that a condenser 37 exists at least practically at the output terminal 5, the time constant of the output terminal 5 becomes larger than the time constant of the input terminal 1. Thus, despite the fact that inadequate voltage is supplied to the microcomputer connected to the output terminal 5 due to the Lag introduced by the capacitor 37, the microcomputer is changed to a high clock mode. Consequently, the microcomputer connected to the output terminal 5 becomes out of control.

An object of the present invention is to stabilize the output voltage from the output terminal 5 and to reduce a chip size in order to lower costs and prevent the microcomputer from becoming out of control.

SUMMARY OF THE INVENTION

In order to resolve the aforementioned problems, in the present invention, even if the quantity of current flowing in a switching transistor provided as a switching means, or the resistance value varies when the switching transistor is turned on, the output voltage of the output terminal 5 feedbacks any variation thereof to the switching transistor which turns on so as to output precisely a controlled constant voltage. Further, for reducing the size of the IC chip, a voltage regulator provided for feed-back is formed as a circuit which controls voltage of a gate electrode in the switching transistor so that the size of the transistor of the voltage regulator is reducible.

In accordance with the present invention, the output state transmitting circuit controls the output of the voltage detector 7. Namely, another voltage detector monitors the output terminal 5 and when the output of this voltage detector inverts, the output signal of the voltage detector 7 is also inverted to prevent from outputting until the voltage of the output terminal 5 becomes a minimum operating voltage at which the microcomputer can operate in a high clock mode. Further, by utilizing the output of the voltage detector 7, the consumptive current of a voltage detector 16 connected to the input terminal 2 is cut off so that the switching circuit has a low consumptive current.

The switching circuit of the present invention has a voltage controlling circuit to supply a voltage to the gate of the switching transistor, and the current driving capacity of the voltage regulator therefore can be reduced. That is, the size of the voltage controlling circuit can be reduced. Further, the voltage is controlled very precisely by a feedback circuit and is provided at the output terminal.

A second voltage detector is provided at the output terminal 5, so that the voltage value of the output terminal 5 can be always detected. If the voltage detector detects that the voltage of the output terminal 5 rises to a level higher than the voltage that the microcomputer can handle, the output of the first voltage detector 7, which is the first means for detecting input voltage inverts, such that the microcomputer can be prevented from becoming uncontrollable. An output signal of the voltage detector 7 is supplied to a transistor in a voltage detector 16, and by using output of the voltage detector 7, the consumptive current of the second voltage detector 16 which is the second means for detecting the second input voltage at the input terminal 2 can be cut off.

DETAILED DESCRIPTION OF THE PREFERRED EMBODIMENTS

Figure 1:
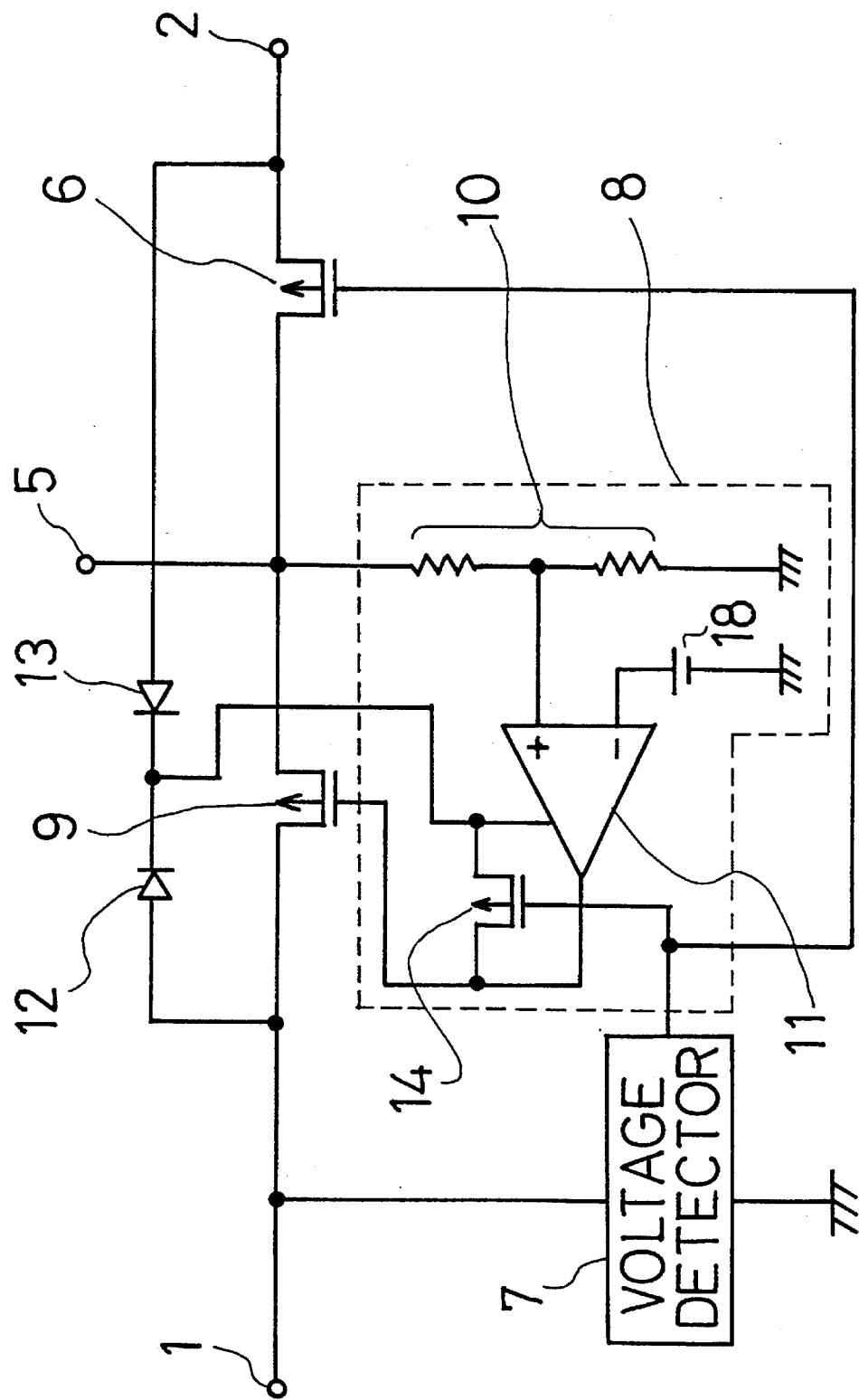
FIG. 1 is a diagram showing a switching circuit according to the present invention.

FIG. 1 is a circuit diagram showing the inventive switching circuit in which two input terminals are provided. A voltage detector 7 serving as a means for detecting a level of the input voltage monitors voltage at an input terminal 1. A switching transistor 9 which is controlled by an output voltage of a voltage controlling circuit 8 and which works as means for providing the input voltage to an output terminal 5 is provided between the input terminal 1 and the output terminal 5. A switching transistor 6 is provided between an input terminal 2 and the output terminal 5. A resistance divider 10 is connected to the output terminal 5 for dividing voltage of the output terminal 5. A node of the resistance divider is connected to a positive input terminal of a difference amplifier 11. Reference voltage 18 is inputted to a negative input terminal of the difference amplifier 11. Output of the difference amplifier 11 which serves as the voltage controlling circuit 8 is connected to a gate of the transistor 9 so as to control the conducting state and non-conducting state of the transistor 9. The input terminal 1 and the input terminal 2 which work as input means for supplying power are connected to anodes each of a diode 12 and a diode 13, respectively. A positive power source of the difference amplifier 11 is supplied from a node of the diode 12 and the diode 13 which have their cathodes connected with each other.

Further, the voltage controlling circuit 8 functions as means for providing the voltage at the input terminal to the output terminal 5. Further, the voltage controlling circuit 8 also controls the level of the output voltage at the output terminal 5 so as to be a constant value. A transistor 14 is connected between the diodes and a gate of the transistor 9. The gate of the transistor 14 is connected to an output terminal of the voltage detector 7 and a gate of the switching transistor 6.

Next, operation of the circuit is explained below. Suppose that an inputted voltage to the input terminal 1 is $V_1$ and an inputted voltage to the input termination 2 is $V_2$. When the $V_1$ voltage rises and exceeds a predetermined voltage of the voltage detector 7, an output signal at the output terminal becomes a high voltage level. As a result, the switching transistor 6 is turned off and the voltage controlling circuit 8 comprising the transistor 9, the resistance divider 10, the difference amplifier 11 and the transistor 14 regulates voltage so that constant voltage is stably outputted to the output terminal 5.

Figure 2:
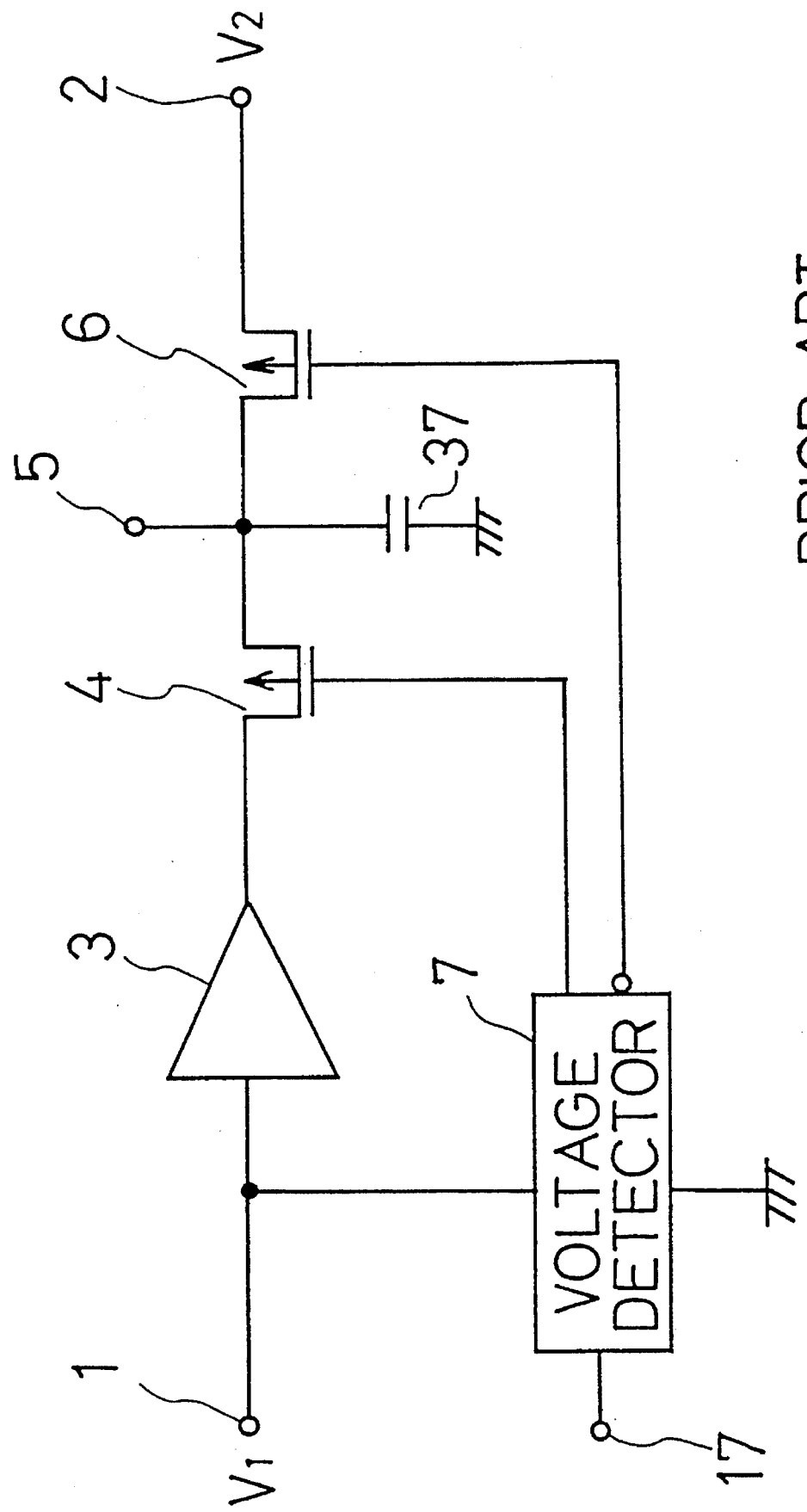
FIG. 2 is a diagram showing a conventional switching circuit.

The present invention is characterized in that the voltage controlling circuit 8 controls the gate voltage of the transistor 9 acting as a switching means. Therefore, the current driving capacity of the voltage controlling circuit 8 can be reduced to be a small value. In other words, the size of the voltage controlling circuit 8 can be reduced as opposed to the regulating circuit 3 of the prior art device shown in FIG. 2.

Further, the voltage at the output terminal 5 is fedback to a gate electrode of the transistor 9 through the difference amplifier 11 so as to be constant with a reference voltage 18. At that time, $V_1$ or $V_2$, whichever is higher than the other, will be the voltage outputted to the positive power source of the difference amplifier 11 regardless of the various switching operations, as the voltage is supplied from the conjunction of the diodes 12 and 13. Therefore, the difference amplifier 11 works stably regardless of switching operation and load variation. To the contrary, when the voltage $V_1$ of the input terminal 1 falls below the predetermined level, the output of the voltage detector 7 inverts to a low voltage level, and the switching transistor 6 is turned on.

On the other hand, when the transistor 14 is turned on, the gate of the transistor 9 receives a high voltage level, and the transistor 9 is turned off. Thus, the voltage $V_2$ at the input terminal 2 is provided to the output terminal 5. According to the above explanation, the transistor 9 is turned off by means of the transistor 14, however if the output signal from the difference amplifier 11 outputs a sufficiently high voltage level, an output signal of the voltage detector 7 inverts to low voltage and the transistor 9 can be turned off.

As described in the above embodiment, the voltage detector 7 monitors the voltage $V_1$ of the input terminal 1. However, the reason why this voltage detector 7 is provided is to provide a selecting means to determine the proper timing to change the two input voltages, which does not necessitate monitoring the input terminal 1. The voltage detector 7 can alternatively monitor the input terminal 2 depending on the application, or can monitor the two voltages by means of comparison.

For providing the switching means and the selecting means, other constructions than the above embodiment can be applied to the present invention. The aforementioned components can also advantageously be formed of a monolithic IC due to the inventive regulating means. Particularly, it is also possible to use a schottky diode element for the diodes 12 and 13.

Figure 3:
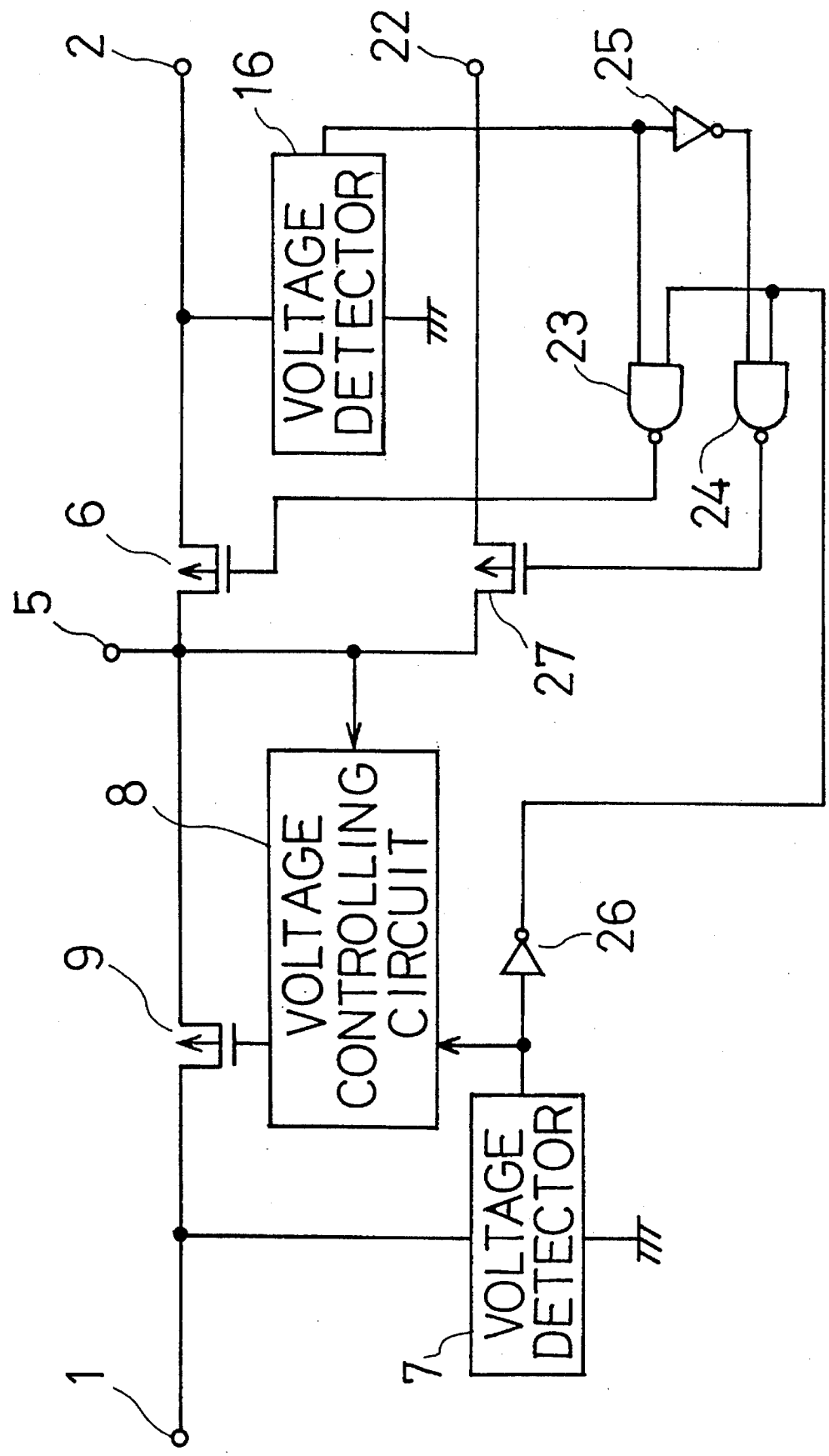
FIG. 3 is a diagram showing a switching circuit of a second embodiment according to the present invention.

FIG. 3 is a circuit diagram showing a second embodiment of the inventive switching circuit wherein three or more voltages interchange. The voltage detector 7 is connected to the input terminal 1 so as to detect voltage at the input terminal 1. The voltage detector 7 supplies the output signal to an input terminal of a first NAND gate 23 and a second NAND gate 24 through an inverter 26. An output signal of the voltage controlling circuit 8 inputs to a gate electrode of the switching transistor 9 to control the switching state of the transistor 9. Input terminals 1, 2, and 22 are connected to the output terminal 5 through transistors 9, 6 and 27 respectively. A second voltage detector 16 connects to the input terminal 2 so as to detect a second input voltage, and an output signal of the second voltage detector 16 is connected to one input terminal of the NAND gate 23 and one input terminal of the NAND gate 24 through an inverter 25. Output terminals of the NAND gates 23 and 24 are connected to the gates of the transistors 6 and 27 respectively.

Next, the description is given for operation of the circuit. A main power source is connected to the input terminal 1. The input terminal 2 and the input terminal 22 are connected to a sub power source such as a primary battery, and another sub power source such as a secondary battery, respectively. When the voltage of the main power source rises above a predetermined level and the output of the voltage detector 7 inverts from a low voltage level to a high voltage level, the transistor 9 is turned on by the voltage controlling circuit 8 and each of the transistors 6 and 27 is turned off through the inverter 26 and the NAND circuits 23 and 24. Consequently, a voltage of the main power source is regulated by the voltage controlling circuit 8 so that a constant voltage is outputted to the output terminal 5. To the contrary, when the main power source reduces below a predetermined level, the output signal of the voltage detector 7 inverts from a high voltage level to a low voltage level and the transistor 9 is turned off by the voltage controlling circuit 8. Further, either the transistor 6 or the transistor 27 is turned on by means of the inverter 26 and the NAND circuits 23 and 24. As a result, either voltage of the two sub power sources is outputted to the output terminal 5 through the particular one of the switching transistors which turns on. At that time, the output voltage which outputs either voltage of two sub power sources depends on the voltage detector 16, the inverter 25, and the NAND circuits 23 and 24.

When the voltage from the sub power source of a primary battery inputted to the input terminal 2 is higher than the predetermined voltage value detected by the voltage detector 16, the output signal of the voltage detector 16 is at a high level of voltage. Therefore, the inverter 25 and the NAND circuits 23 and 24 turn on the transistor 6 and turn off the transistor 27. Consequently, the voltage of a primary battery supplied to the sub power source at input terminal 2 is outputted to the output terminal 5. On the other hand, when the voltage of a primary battery supplied to the sub power source is lower than the predetermined voltage value detected by the voltage detector 16, the output of the voltage detector 16 is at a low level. Then, the transistor 6 is turned off and the transistor 27 is turned on. At that time, the voltage from the sub power source of a secondary battery inputted to the input terminal 22 is supplied to the output terminal 5.

A detecting voltage of the voltage detector 7 is set to a level higher than that of the minimum operating voltage of the load, such as the microcomputer, connected to the output terminal 5. For instance, when the microcomputer is operated at 3 V±10%, the detecting voltage is higher than 2.7 V. On the other hand, a detecting voltage of the voltage detector 16 is set to higher than the minimum memory maintaining voltage of the load such as an SRAM connected to the output terminal 5. This is usually higher than 2 V. According to the present embodiment, P-channel transistors are employed for the transistors 6 and 27. However, N-channel transistors can be also employed on the condition that the voltage of the main power source and the sub power source is negative. As well, according to the present invention, the voltage detector 16 is utilized for switching the sub power source of a primary battery and that of a secondary battery. However, the transistors 6 and 27 can be switched on and off by utilizing the feature that the output of a comparator inverts when the voltage value of a primary battery supplied to the sub power source is lower than that of a secondary battery supplied to the sub power source comparing the primary battery of the sub power source with the secondary battery of the sub power source.

In this embodiment, each substrate of the P-channel transistors constituting the transistors 6 and 27 is floated. But, the substrates of the transistors 6 and 27 can be connected to one transistor electrode on the side of the output terminal 5. When the secondary battery connects to the input terminal 22 so as to be the sub power source, for example, the substrate of the transistor 27 can be connected to one transistor electrode on the side of the input terminal 22.

As shown in the embodiment of FIG. 3, one of the input voltage of the transistors 6, 9, and 27 is outputted from a respective one of the three input terminals to the output terminal 5. A selecting means for driving each of these three transistors is controlled by output of the first and second voltage detectors 7 and 16. Particularly, when the number of input voltage is more than three as in this preferred embodiment, it is necessary to provide several voltage detectors for detecting input voltage of at least two input terminals and then to provide selecting means for controlling the switching state of the transistors acting as switching means in accordance with the output voltage of the several voltage detectors. As shown in FIG. 3, it is one of the selecting means that input voltage is selected in the following order: the input terminal 1; the input terminal 2; the input terminal 22; in order to detect desired voltage of each voltage detector. As shown in FIG. 3, a selecting control circuit including selecting means comprises the voltage controlling circuit 8, the NAND circuits 23 and 24, and the inverters 25 and 26. For selecting means, the NAND circuits 23–24 and the inverters 25–26 are provided in the selecting control circuit.

Figure 4:
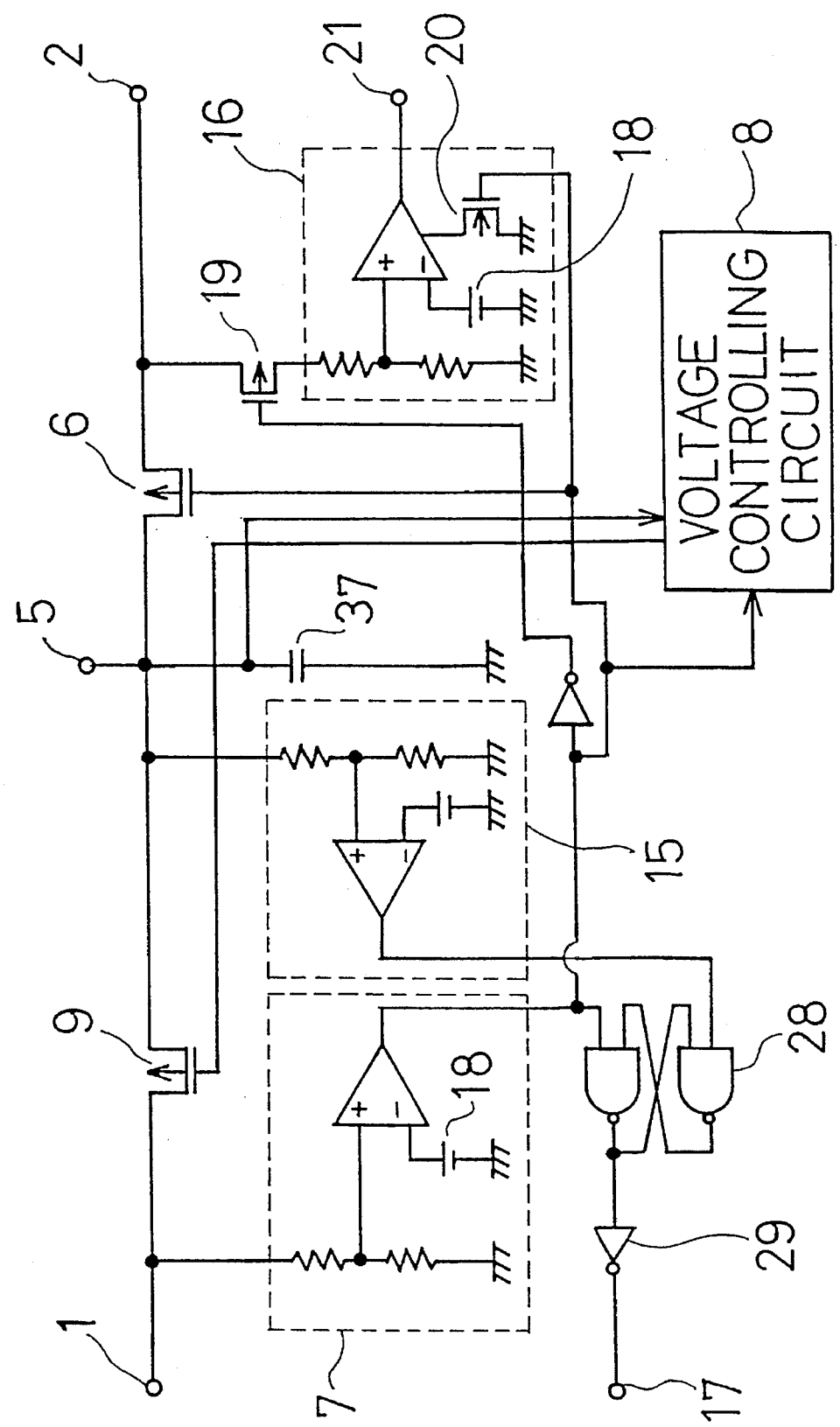
FIG. 4 is a diagram showing a switching circuit of a third embodiment according to the present invention.

FIG. 4 is a circuit diagram showing another switching circuit of the present invention. According to this embodiment, an output signal of an output state transmitting circuit as an interrupt signal to a microcomputer is outputted from a signal output terminal 17. A resistance divider of a voltage detector 7 functioning as a first input voltage detecting circuit is connected to an input terminal 1 so as to detect a voltage value at input terminal 1. The input terminal 1 is connected to an output terminal 5 through a transistor 9 and an input terminal 2 is connected to the output terminal 5 through a transistor 6. A resistance divider of a voltage detector 15 is connected to the output terminal 5 so as to detect a voltage value at output terminal 5. A resistance divider of a voltage detector 16 functioning as a second input voltage detecting circuit is connected to the input terminal 2 through a transistor 19 so as to detect a voltage value at input terminal 2. Both the output of the voltage detector 7 and that of the voltage detector 15 are inputted to a latch circuit 28 and the output signal used as the interrupt signal is outputted from the signal output terminal 17.

Further, the output signal of the voltage detector 7 is inputted to a gate of a transistor 20 which is incorporated into a part of a power source line of a comparator in the voltage detector 16. Similarly to FIG. 1, an output signal of a voltage controlling circuit 8 and that of the voltage detector 7 are connected to a gate of a transistor 9 and that of the transistor 6 respectively. The output state transmitting circuit comprises the latch circuit 28 and an inverter 29. In the output state transmitting circuit, both output of the voltage detectors 7 and 15 are inputted to the latch circuit 28 so that an interrupt signal is outputted from the inverter 29. In other words, the output signal of the inverter 29 is output as the interrupt signal from the signal output terminal 17.

Next, the description will be given for operation of the circuit. A main power source is connected to the input terminal 1 and a sub power source is connected to the input terminal 2. Either voltage of the main power source and the sub power source in response to a signal from the voltage controlling circuit 8 is selectively outputted to the output terminal 5. For example, when the signal from the voltage controlling circuit 8 is for turning on the transistor 9 and off the transistor 6, the voltage of the main power source is outputted to the output terminal 5. In an opposite case, the voltage of the sub power source is outputted to the output terminal 5.

Now, the case will be taken that the voltage of the main power source rises and the transistor 9 and the transistor 6 turn on and off respectively. The voltage detector 7 inverts its output to a high level of voltage when the main power source rises to, for example, about 4 V. Then the voltage detector 15 inverts its output to a low level of voltage when the voltage of the output terminal 5 rises to, for example, about 3 V. If the main power source is supplied to the input terminal 1, the voltage of the input terminal 1 rises rapidly. In this case, because of a time constant circuit comprising a condenser 37 connected to the transistor 9 and the output terminal 5, the voltage of the output terminal 5 rises more slowly than the voltage of the input terminal 1.

In the aforementioned case, the output signal of the voltage detector 7 changes before that of the voltage detector 15. At that time, the signal output terminal 17 maintains a low voltage level since the latch circuit is provided in the output state transmitting circuit. Therefore the output state transmitting circuit indicates that the output is still low voltage. Thereafter, when the voltage of the output terminal 5 rises to about 3 V at a time constant evaluated by the resistance of the transistor 9 which is turned on and the condenser 37, the output signal of the voltage detector 15 inverts to a low voltage level. Therefore, output of the signal output terminal 17 at that time inverts to a high level of voltage. In other words, after the voltage of the output terminal 5 rises to higher than 3 V, the signal output terminal 17 outputs a signal indicating that the output state is high voltage.

Reversely, in case that the voltage of the main power source falls, the voltage detector 7 inverts to a low level of voltage in the vicinity of 4 V prior to the voltage detector 15. Hence, the signal output terminal 17 at that time inverts to a low level of voltage. It is preferable that the voltage value of an output inversion of the voltage detector 7 is set to higher than the output voltage value of the voltage controlling circuit by about 0.5–2.5 V. As well, it is preferable that the voltage value of the output inversion of the voltage detector 15 is set to higher than the maximum value of the voltage at which a microcomputer gets out of control.

Since an inversion signal of output of the voltage detector 7 is inputted to a gate of the transistor 19 incorporated into a part of the resistance group of the voltage detector 16 detecting the voltage of the sub power source, when the voltage of the main power source supplied to the input terminal 1 rises and then the output of the voltage detector 7 inverts to a high level of voltage, the transistor 19 is turned on and therefore a voltage is generated at the middle point of the resistance group. Further, a comparator in the voltage detector 16 is supplied with a power source, as the transistor 19 is turned on, and then the voltage detector 16 starts to operate. In this state, the voltage detector 16 monitors the voltage of the sub power source and then inverts its output according to the voltage drop of the sub power source so as to transmit the voltage of the sub power source through the signal output terminal 21. Reversely, when the output of the voltage detector 7 gets a low level of voltage, the circuit current of the voltage detector 16 is cut off and so the voltage detector 16 ceases the operation. In general, a primary or secondary lithium battery is widely used for the sub power source, thereby it is preferable that the inversion voltage of the voltage detector 16 is set to between 2.4 V and 2.8 V.

In this embodiment, means for cutting the circuit current of the voltage detector 16 is illustrated with the transistors 19 and 20. However, other cutting means can be employed if the circuit current of the voltage detector 16 can be cut off when the voltage of the main power source falls to less than a certain constant voltage. Further, in this embodiment, the voltage detector is constituted of the resistance group, a reference voltage 18, and the comparator, however the circuit configuration is not restricted to the above. Any voltage detector having a different configuration from the above can be basically used if it can detect an arbitrary voltage. Further, the positive power sources of each voltage detector, the latch circuit, and the inverters can be supplied from either the main power source or the sub power source. The voltage can be supplied to each of the voltage detectors, the latch circuit, and the inverters or only some of them from the point where the cathodes of two diodes in which the main power source and the sub power source are connected to the anodes respectively are connected with each other. As well, the present invention can also apply to the case of three or more voltages interchanges so that one output terminal outputs one of these voltages.

The output state transmitting circuit can be constituted of another configuration other than that comprising the latch circuit and the inverter. A main function of that is to indicate an output state in response to output of the output terminal 5. However, if only a signal of the voltage detector 15 acting as a voltage detecting circuit is used, the interrupt signal gets unstable as the load varies. So, in the present invention, the interrupt signal is generated from the output state transmitting circuit by both outputs from the input voltage detecting circuit and the output voltage detecting circuit, so the interrupt signal, that is, the output state transmitting signal can be stably generated regardless of a variation of input or output.

As mentioned above, according to the present invention, the switching circuit wherein two or more input voltages interchange so as to output one voltage among the above voltages to the output terminal has a switching function through the gate electrode of the switching transistor. Therefore, the chip size of the switching circuit constituted a monolithic IC can be greatly reduced so that the switching circuit can be provided at low cost.

What is claimed is:

1. A switching circuit for supplying an output voltage at an output terminal from a plurality of input voltages provided at input terminals, comprising:

a plurality of input terminals each having an input voltage provided thereto;

an output terminal for selectively outputting a respective one of the input voltages;

first voltage detecting means for detecting a level of a first input voltage at a first one of the input terminals and providing an output signal in accordance with the level;

first switching means for supplying to the output terminal the first input voltage from the first input terminal according to the output signal of the first voltage detecting means;

second switching means for supplying to the output terminal a second input voltage from a second one of the input terminals, wherein the output signal of the first voltage detecting means alternatively activates one of the first switching means and the second switching means such that one of the first or second input voltages is supplied to the output terminal in accordance with the output signal of the first voltage detecting means;

voltage controlling means for controlling a conducting state of the first switching means according to the voltage at the output terminal; and voltage selecting means for selecting one of the plurality of input voltages for powering the voltage controlling means.

2. A switching circuit for supplying an output voltage at an output terminal from a plurality of input voltages provided at input terminals, comprising:

a plurality of input terminals each having an input voltage provided thereto;

an output terminal for selectively outputting a respective one of the input voltages;

first voltage detecting means for detecting a level of a first input voltage at a first one of the input terminals;

first switching means for supplying to the output terminal the first input voltage from the first input terminal according to an output signal of the first voltage detecting means;

second switching means for supplying to the output terminal a second input voltage from a second one of the input terminals;

second voltage detecting means for detecting a level of the second input voltage at the second input terminal;

third switching means for supplying to the output terminal a third input voltage from a third one of the input terminals;

voltage controlling means for controlling a conducting state of the first switching means according to the voltage at the output terminal; and selecting means for selecting to supply to the output terminal one of the second input voltage and the third input voltage in accordance with output signals of the first voltage detecting means and the second voltage detecting means.

3. A switching circuit for supplying an output voltage at an output terminal from an input voltage inputted at an input terminal, comprising:

first voltage detecting means for detecting a level of an input voltage at an input terminal;

switching means for outputting to an output terminal the input voltage from the input terminal;

voltage controlling means for controlling a conducting state of the switching means according to the output voltage outputted at the output terminal;

second voltage detecting means for detecting a level of the output voltage at the output terminal; and output voltage monitoring means for detecting the output voltage at the output terminal according to the input voltage inputted to the input terminal by using output signals of the first voltage detecting means and the second voltage detecting means.

4. A switching circuit for supplying an output voltage at an output terminal from a plurality of input voltages provided at input terminals, comprising:

a plurality of input terminals each having an input voltage provided thereto;

an output terminal for selectively outputting a respective one of the input voltages;

first voltage detecting means for detecting a level of a first input voltage at a first one of the input terminals and providing an output signal in accordance with the level;

first switching means for supplying to the output terminal the first input voltage from the first input terminal according to the output signal of the first voltage detecting means;

second switching means for supplying to the output terminal a second input voltage from a second one of the input terminals, wherein the output signal of the first voltage detecting means alternatively activates one of the first switching means and the second switching means such that one of the first or second input voltages is supplied to the output terminal in accordance with the output signal of the first voltage detecting means;

voltage controlling means for controlling a conducting state of the first switching means according to the voltage at the output terminal;

second voltage detecting means for detecting a level of the second input voltage and providing an output signal in accordance therewith; and output state transmitting means receptive of the output signals of the first and second voltage detecting means and outputting a state signal in accordance therewith, the output state transmitting means including logic circuitry operable to invert the state signal when the output signals of both of the first and second voltage detecting means have inverted to thereby prevent the output signal at the output terminal from becoming out of control.

5. A switching circuit for supplying an output voltage at an output terminal from a plurality of input voltages provided at input terminals, comprising:

a plurality of input terminals each having an input voltage provided thereto;

an output terminal for selectively outputting a respective one of the input voltages;

first voltage detecting means for detecting a level of a first input voltage at a first one of the input terminals and providing an output signal in accordance with the level;

first switching means for supplying to the output terminal the first input voltage from the first input terminal according to the output signal of the first voltage detecting means;

second switching means for supplying to the output terminal a second input voltage from a second one of the input terminals, wherein the output signal of the first voltage detecting means alternatively activates one of the first switching means and the second switching means such that one of the first or second input voltages is supplied to the output terminal in accordance with the output signal of the first voltage detecting means;

voltage controlling means for controlling a conducting state of the first switching means according to the voltage at the output terminal;

second voltage detecting means for detecting a level of the second input voltage and providing an output signal in accordance therewith; and output state transmitting means receptive of the output signals of the first and second voltage detecting means and outputting a state signal in accordance therewith;

wherein the first voltage detecting means includes means for controlling the conducting state of the first and second switching means when the output signal of the second voltage detecting means exceeds a predetermined value to thereby prevent the output signal at the output terminal from becoming out of control.

6. A switching circuit for supplying an output voltage at an output terminal from a plurality of input voltages provided at input terminals, comprising:

a plurality of input terminals each having an input voltage provided thereto;

an output terminal for selectively outputting a respective one of the input voltages;

first voltage detecting means for detecting a level of a first input voltage at a first one of the input terminals and providing an output signal in accordance with the level;

first switching means for supplying to the output terminal the first input voltage from the first input terminal according to the output signal of the first voltage detecting means;

second switching means for supplying to the output terminal a second input voltage from a second one of the input terminals, wherein the output signal of the first voltage detecting means alternatively activates one of the first switching means and the second switching means such that one of the first or second input voltages is supplied to the output terminal in accordance with the output signal of the first voltage detecting means; and voltage controlling means for controlling a conducting state of the first switching means according to the voltage at the output terminal, the voltage controlling means comprising a resistor divider network connected to the output terminal, and a difference amplifier connected at a node of the resistor divider network for outputting a signal proportional to a difference between the voltage at the output terminal and a reference voltage for controlling the conductivity of the first switching means according to the difference.

7. A switching circuit according to claim 6; further comprising a diode having an anode connected to the first input terminal and another diode having an anode connected to the second input terminal, cathodes of the diodes being connected together, wherein a power supply input of the difference amplifier is connected to a node between the diodes.

8. A switching circuit for supplying an output voltage at an output terminal from a plurality of input voltages at input terminals, comprising:

first voltage detecting means for detecting a level of an input voltage inputted to a first input terminal;

first switching means for outputting to the output terminal a first input voltage inputted from the first input terminal according to an output signal of the first voltage detecting means;

a second switching means for outputting to the output terminal a voltage inputted from a second input terminal, wherein an output signal of the first voltage detecting means alternatively activates the first switching means and the second switching means;

voltage controlling means for controlling a conducting state of the first switching means according to the voltage outputted at the output terminal, the voltage controlling means comprising a resistor divider network connected to the output terminal, and a difference amplifier connected at a node of the resistor divider network for outputting a signal proportional to a difference between the voltage at the output terminal and a reference voltage for controlling the conductivity of the first switching means according to the difference; and second voltage detecting means for detecting a level of voltage of input voltage inputted from the second input terminal, wherein the output signal of the first voltage detecting means controls an operation of the second voltage detecting means.

9. A switching circuit according to claim 8; further comprising a diode having an anode connected to the first input terminal and another diode having an anode connected to the second input terminal, cathodes of the diodes being connected together, wherein a power supply input of the difference amplifier is connected to a node between the diodes.

* * * * *